(12) United States Patent
Sims et al.

(10) Patent No.: US 10,983,757 B2
(45) Date of Patent: Apr. 20, 2021

(54) NANOMATERIAL-BASED TRUE RANDOM NUMBER GENERATOR

(71) Applicant: United States of America as respresented by the Secretary of the Navy, San Diego, CA (US)

(72) Inventors: Patrick Craig Sims, Laguna Hills, CA (US); Israel Perez, San Diego, CA (US); John D. Rockway, San Diego, CA (US); Sara R. Wheeeland, Chula Vista, CA (US); Oren Sternberg, San Diego, CA (US)

(73) Assignee: United States of America as represented by the Secretary of the Navy, Washington, DC (US)

( * ) Notice: Subject to any disclaimer, the term of this patent is extended or adjusted under 35 U.S.C. 154(b) by 235 days.

(21) Appl. No.: 16/284,046

(22) Filed: Feb. 25, 2019

(65) Prior Publication Data
US 2020/0272421 A1  Aug. 27, 2020

(51) Int. Cl.
*G06F 7/58* (2006.01)
*H03K 3/84* (2006.01)
(Continued)

(52) U.S. Cl.
CPC ............ *G06F 7/588* (2013.01); *G06F 7/582* (2013.01); *H01L 21/02345* (2013.01);
(Continued)

(58) Field of Classification Search
CPC .......... G06F 7/588; G06F 7/582; H03K 3/84; H01L 51/004; H01L 51/055; H01L 21/02345; H01L 51/0558
(Continued)

(56) References Cited

U.S. PATENT DOCUMENTS 6,571,263 B1 * 5/2003 Nagai ..................... G06F 7/588
708/255
7,007,060 B2 * 2/2006 Miller, Jr. ............... G06F 7/588
708/255
(Continued)

OTHER PUBLICATIONS

Kim et al "Nano-Intrinsic True Random Number Generation", pp. 1-9, arXlv:1701.06020v1 [cs.ET] Jan. 21, 2017.*
(Continued)

*Primary Examiner* — Tan V Mai
(74) *Attorney, Agent, or Firm* — Naval Information Warfare Center, Pacific; Kyle Eppele; J. Eric Anderson

(57) ABSTRACT

A true random number generator including a transistor, a first voltage source, a second voltage source, and a comparator. The transistor has a first electrode, a second electrode, and a third electrode. Two of the electrodes are electrically connected by a channel of conductive nanomaterial. The first voltage source is electrically connected to the first electrode and the second voltage source is electrically connected to the second electrode. The comparator is electrically connected to the third electrode and is configured to classify a measured electrical property at the third electrode as either HIGH or LOW based on a comparison of the measured electrical property with a reference value. The measured electrical property varies over time due to random telegraph signals (RTSs) due to defects in the transistor.

19 Claims, 5 Drawing Sheets

(51) Int. Cl.
*H01L 51/00* (2006.01)
*H01L 51/05* (2006.01)
*H01L 21/02* (2006.01)

(52) U.S. Cl.
CPC ........ *H01L 51/0048* (2013.01); *H01L 51/055* (2013.01); *H01L 51/0558* (2013.01); *H03K 3/84* (2013.01)

(58) Field of Classification Search
USPC .............................................. 708/3, 250–255
See application file for complete search history.

(56) References Cited

U.S. PATENT DOCUMENTS

| | | | | |
|---|---|---|---|---|
| 7,099,906 B2* | 8/2006 | Messina | ................ | H03B 29/00 708/255 |
| 7,426,527 B2* | 9/2008 | Strum | ..................... | G06F 7/588 708/256 |
| 7,885,990 B2* | 2/2011 | Dover | ..................... | G06F 7/588 708/255 |
| 8,307,022 B2* | 11/2012 | Matsumoto | ............. | G06F 7/588 708/255 |
| 8,874,631 B2 | 10/2014 | Matsumoto et al. | | |
| 2017/0161022 A1* | 6/2017 | Chen | ................. | H01L 29/42324 |

OTHER PUBLICATIONS

Zeghbroeck, "7.1 The MOSFET—Introduction" (Year: 1996).*
Alisha Wissanji; Two-level conductance fluctuations in single-walled carbon nanotubes containing carboxylate defects; University of California Irvine, 2012.

* cited by examiner

NANOMATERIAL-BASED TRUE RANDOM NUMBER GENERATOR

FEDERALLY-SPONSORED RESEARCH AND DEVELOPMENT

The United States Government has ownership rights in this invention. Licensing and technical inquiries may be directed to the Office of Research and Technical Applications, Space and Naval Warfare Systems Center, Pacific, Code 72120, San Diego, Calif., 92152; voice (619) 553-5118; ssc_pac_t2@navy.mil. Reference Navy Case Number 104033.

BACKGROUND OF THE INVENTION

Random number generators are ubiquitous in data, communication, radar, and simulation applications. Current methods of random number generation include both pseudo-random number generators and true random number generators. Pseudo-random number generators (PRNG) use a mathematical algorithm to transform an input, known as a seed, into a pseudo-random sequence. Disadvantages to this approach include that pseudo-random sequences are deterministic, periodic, and can be correlated. PRNGs can be vulnerable to brute force attacks such as: (1) where the attacker exhaustively tries all combinations to determine the key/algorithm to break encryption; (2) input-based attacks, where the attacker uses known or chosen inputs to break encryption; and (3) state compromise extension attacks, where the attacker puts the PRNG into a known state that can compromise previous, current, or future encryption. True random generators use random natural phenomenon to generate random sequences. Current approaches may include noise in electronic devices, atmospheric variations, radiation decay times, and photon detection. Disadvantages to these approaches can include large size, high power requirements, limited bit-rate compared to PRNG, and environmental vulnerabilities (e.g. radiation and high temperature). A need exists for an improved random number generator.

SUMMARY

Disclosed herein is a true random number generator comprising a transistor, a first voltage source, a second voltage source, and a comparator. The transistor has a first electrode, a second electrode, and a third electrode. Two of the electrodes are electrically connected by a channel of conductive nanomaterial. The first voltage source is electrically connected to the first electrode and the second voltage source is electrically connected to the second electrode. The comparator is electrically connected to the third electrode and is configured to classify a measured electrical property at the third electrode as either HIGH or LOW based on a comparison of the measured electrical property with a reference value. The measured electrical property varies over time due to random telegraph signals due to defects in the transistor.

The true random number generator disclosed herein may be used to generate random numbers according to the following method steps. The first step provides for applying a first voltage to a first electrode. The next step provides for applying a second voltage to a second electrode that is separated from a third electrode by a channel of conductive nanomaterial. The second and third electrodes are both disposed on, and separated from the first electrode by, a dielectric layer. The next step provides for measuring an electrical property at the third with a comparator that is configured to compare the measured electrical property with a reference value and to classify the measured electrical property as either HIGH or LOW based on the comparison with the reference value. The measured electrical property varies randomly over time due to random telegraph signals due to defects in one or both of the dielectric layer and the channel of conductive nanomaterial. The next step provides for sampling the comparator at a given rate with a flip-flop circuit such that the flip flop circuit outputs a "1" or a "0" depending on whether the measured electrical property is respectively HIGH or LOW. The next step provides for assembling a binary sequence based on the output from the flip-flop circuit.

BRIEF DESCRIPTION OF THE DRAWINGS

Throughout the several views, like elements are referenced using like references. The elements in the figures are not drawn to scale and some dimensions are exaggerated for clarity.

DETAILED DESCRIPTION OF EMBODIMENTS

The disclosed apparatus and method below may be described generally, as well as in terms of specific examples and/or specific embodiments. For instances where references are made to detailed examples and/or embodiments, it should be appreciated that any of the underlying principles described are not to be limited to a single embodiment, but may be expanded for use with any of the other methods and systems described herein as will be understood by one of ordinary skill in the art unless otherwise stated specifically.

Figure 1:
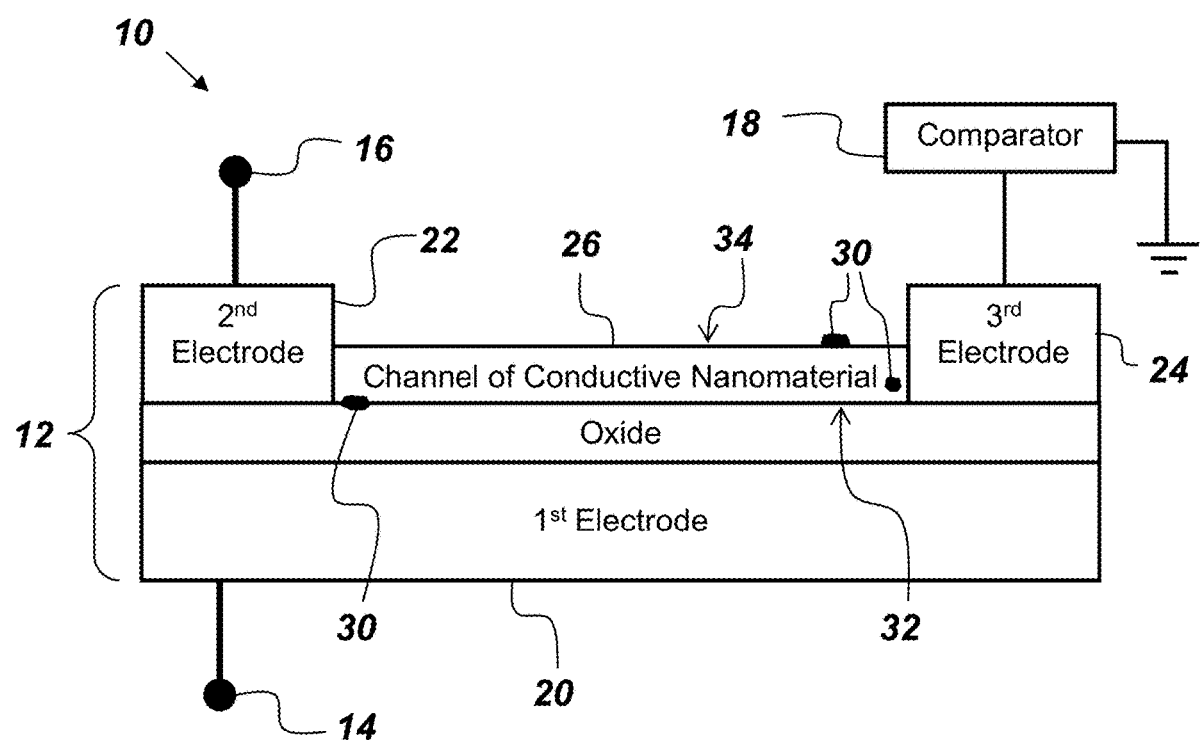
FIG. 1 is a side-view illustration of an embodiment of a true random number generator.

FIG. 1 is a side-view illustration of an embodiment of a true random number generator (TRNG) 10 that comprises, consists of, or consists essentially of a transistor 12, a first voltage source 14, a second voltage source 16, and a comparator 18. The transistor 12 comprises, consists of, or consists essentially of a first electrode 20, a second electrode 22, and a third electrode 24. Two of the electrodes 20, 22, and 24 are electrically connected by a channel 26 of conductive nanomaterial. In the embodiment of the TRNG 10 shown in FIG. 1, the transistor 12 is in a back gate configuration where the second and third electrodes 22 and 24 are connected by the channel 26, which are all separated from the first electrode 20 by a bottom dielectric layer 28. A suitable example of the bottom dielectric layer 28 is, but is not limited to silicon di-oxide. The first voltage source 14 is electrically connected to the first electrode 20 and the second voltage source 16 is electrically connected to the second electrode 22. The comparator 18 is electrically connected to the third electrode 24 and is configured to classify a measured electrical property at the third electrode 24 as either HIGH or LOW based on a comparison of the measured electrical property with a reference value. The measured electrical property varies over time due to random telegraph signals (RTSs) due to defects in the transistor 12. The TRNG 10 has a small size, weight, and power requirements when compared to prior art TRNGs.

The transistor 12 may have many different geometries including, but not limited to, top gate, back gate, all-around gate, electrolytic-fluid gate, or any combination of these. In the embodiment of the TRNG 10 shown in FIG. 1, the first electrode performs as a gate electrode, the second electrode 22 performs as a source electrode, and the third electrode performs as a drain electrode. The source and drain electrodes are separated by the gate electrode by the dielectric layer, which in this embodiment is an oxide layer. The channel 26 of conductive nanomaterial may be made of carbon nanotube material and may be disposed atop the source-drain electrodes, embedded, or beneath. Other suitable embodiments of the channel 26 include, but are not limited to: graphene nanoribbons, nanowires composed of Si, Ge, metal oxide, III-V semiconductors, and II-VI semiconductor material. In some embodiments, the channel 26 may be suspended above a trench in the underlying bottom dielectric layer 28. The second and third electrodes 22 and 24 may be interdigitated and lead out to form contact pads or interconnects to other devices.

Defects 30 may exist at or near the oxide-nanomaterial interface 32, on the surface 34 of the channel 26 of nanomaterial, or in the nanomaterial itself. The defects 30 change the resistance of the transistor 12 between two or more states. These defects 30 trap and untrap charge leading to resistance changes in the transistor 12. These defects 30 may be produced randomly from the fabrication process or may be introduced by, for example, bombarding the bottom dielectric layer 28 with ionizing radiation, or by introducing molecular or elemental impurities into or onto the bottom dielectric layer 28. In another example embodiment, the defect(s) 30 is/are introduced in the channel 26 nanomaterial, which may be accomplished by, for example, modifying the chemical structure of the nanomaterial using approaches such as oxidation, esterification, amidation, halogenation, cycloaddition, radical addition, nucleophilic addition, electrophilic addition, or irradiation (e.g. ion, electron, or UV). The defects 30 in the nanomaterial may also be intrinsic to the fabrication process used to create the nanomaterial channel 26. These defects 30 may also be used to tether additional molecules to the nanomaterial of the channel 26. In another embodiment, defects may be introduced non-covalently on the nanomaterial using van der Waals or pi-pi interactions.

Figure 2A:
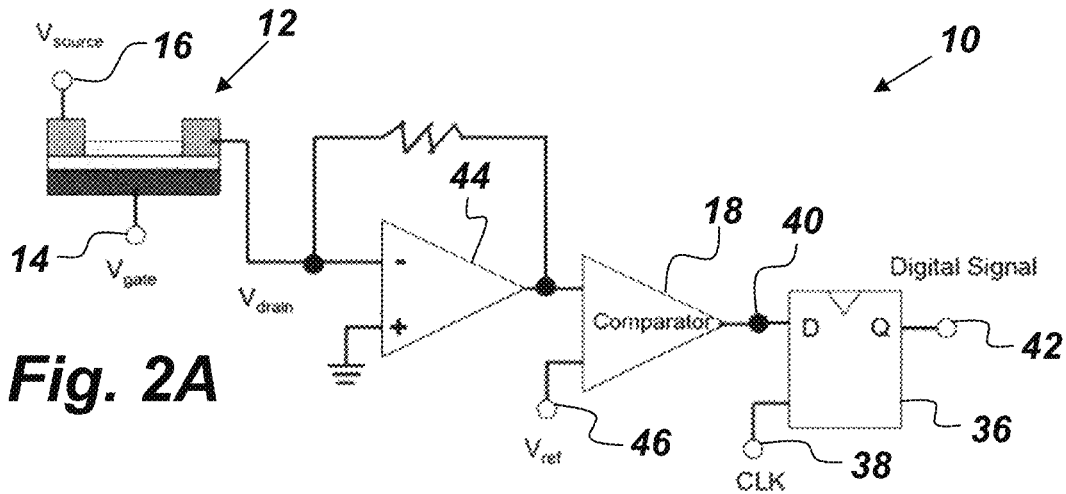
FIGS. 2A-2C are schematic representations of different embodiments of a true random number generator.
Figure 2B:
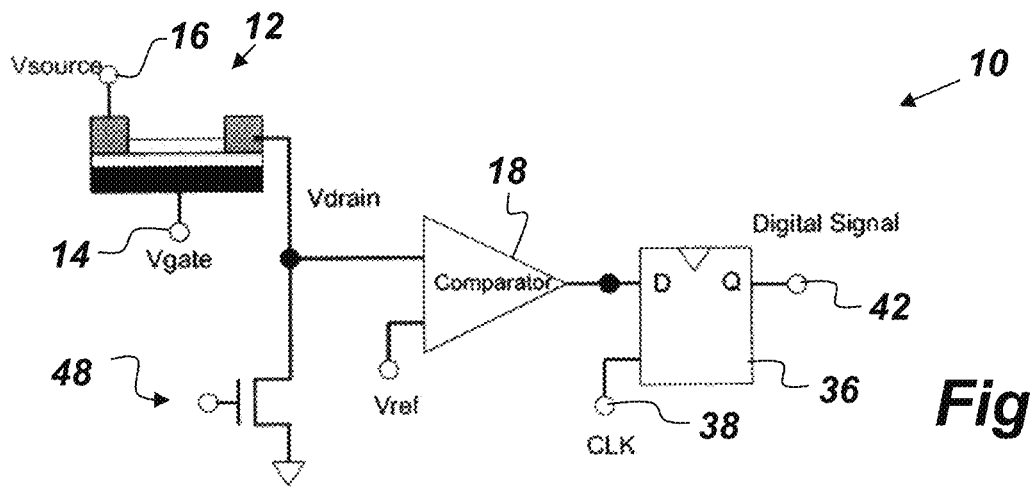
Figure 2C:
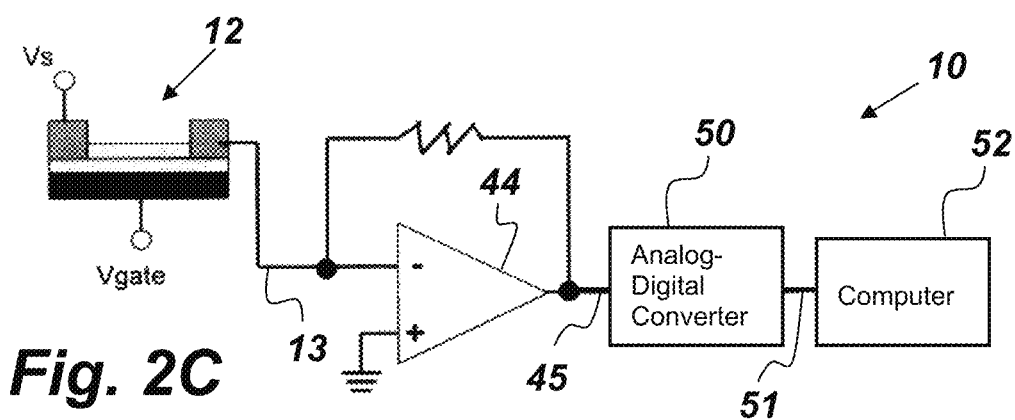

The TRNG 10 may be operated by applying voltage across the second and third electrodes 22 and 24, applying a voltage on the first electrode 20, and measuring the current through the nanomaterial channel 26 as the defect(s) 30 randomly change(s) the resistance of the transistor 12 between two or more states due to RTS. RTS noise in a device is generally considered to be undesirable, but the TRNG 10 takes advantage of RTS noise (which is sometimes referred to as burst noise, popcorn noise, impulse noise, and bi-stable noise) to generate random numbers, which are useful for a host of applications. The resistance of the TRNG 10 may be measured over time by measuring the voltage drop across the second and third electrodes 22 and 24. The measured RTS may then be compared with a reference level such as a reference voltage from a reference voltage source 46 using the comparator 18. The comparator may either be implemented through hardware or software, which classifies the current or resistance values as HIGH or LOW FIGS. 2A, 2B and 2C are circuit diagrams of different embodiments of the TRNG 10. The circuit diagram shown in FIG. 2A is representative of an embodiment of the TRNG 10 which comprises a flip-flop circuit 36 with a clock 38. The flip-flop circuit 36 and the clock 38 may be used to sample an output signal 40 from the comparator 18. The flip-flop 36 may then output a digital signal 42 of a series of HIGHs and/or LOWs or 0's and/or 1's at a desired rate. The digital output signal 42 can be used as a random number or to seed a PRNG. If the binary sequence (i.e., the digital output signal 42) is biased towards either 0's or 1's, a von Neumann extractor algorithm can be used to remove bias through either hardware or software implementation. The voltage applied to the first electrode 20 can be adjusted to modulate the amount of time spent in the various current states to minimize bias between high and low states. The embodiment of the TRNG 10 depicted in FIG. 2A also comprises an optional inverting current amplifier 44 connected between the third electrode 24 and the comparator 18.

The embodiment of the TRNG 10 represented by the schematic diagram shown in FIG. 2B comprises a metal-oxide-semiconductor field-effect transistor (MOSFET) 48 connected to the third electrode 24 and the comparator 18, which is connected to the flip flop circuit 36. The MOSFET 48, in this embodiment of the TRNG 10, serves as a variable resistor that is used to form a voltage divider circuit that can be tuned such that the voltage at the third electrode 24 when in the HIGH state is greater than the reference voltage and the voltage at the third electrode 24 when in the LOW state is less than the reference voltage.

In the embodiment of the TRNG 10 represented in FIG. 2C, the comparator 18 comprises the inverting current amplifier 44, an analog-digital converter (ADC) 50, and a computer 52. The inverting current amplifier 44 is electrically connected to the third electrode 24. The ADC 50 is electrically connected to the inverting current amplifier 44 so as to receive an analog voltage output 45 from the inverting current amplifier 44. The computer 52 is operatively coupled to the ADC 50. The computer 50 is configured to generate a random number based on a digital voltage output 51 of the ADC 50. The inverting current amplifier 44 converts the current output 13 of transistor 12 into the analog voltage output 45. The analog voltage output 45 is converted into the digital voltage output 51 by the ADC 50. The digital voltage output 51 is processed by the computer 52 using software implementations of the comparator 18, flip-flop 36, and von Neumann extractor algorithm operations.

The TRNG 10 is particularly useful in providing true random numbers in unattended sensor networks, unmanned vehicles, and satellites that require small size, low power, and/or radiation resistance. The defects 30 can be manipulated by the surrounding environment to generate a RTS. For example, the TRNG 10 may be submerged in a solution or environment with molecules or ions that interact with the defect 30. For example, this may include conformational changes as the defect or protonation-deprotonation processes in the case of an acid group.

Figure 3A:
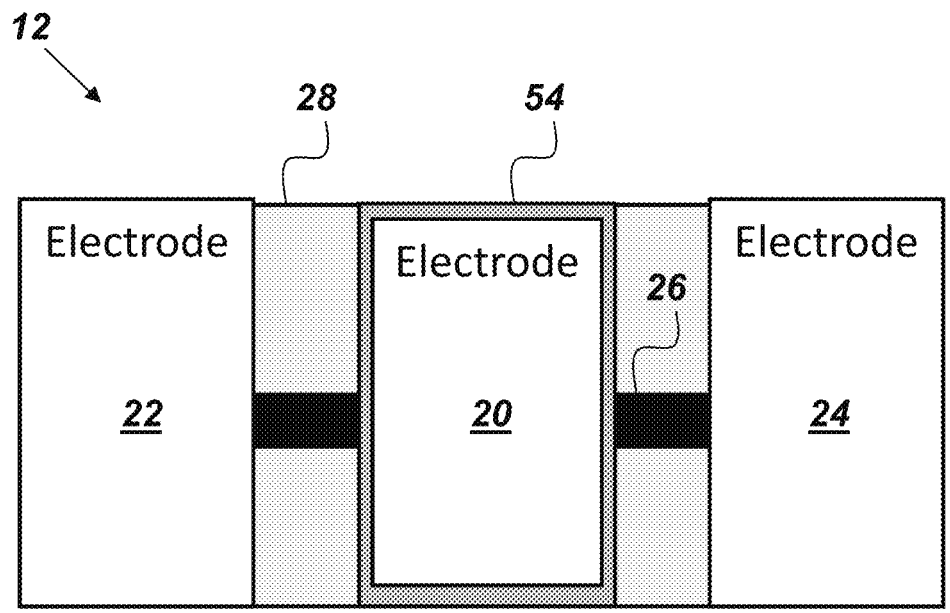
FIGS. 3A and 3B are respectively top and side-view illustrations of an embodiment of a true random number generator.
Figure 3B:
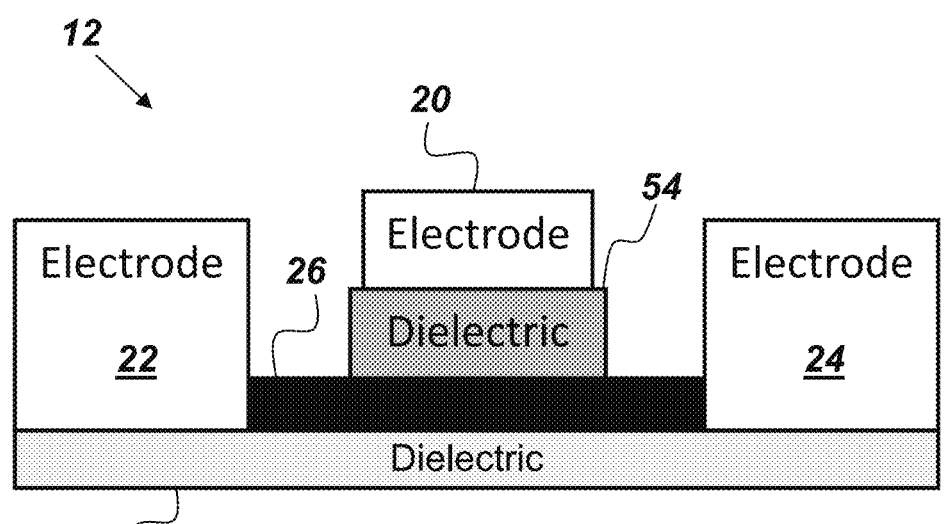

FIGS. 3A and 3B are top and cross-sectional, side views respectively of a top gate embodiment of the transistor 12. In this embodiment of the transistor 12, the second and third electrodes 22 and 24 are still connected by the channel 26 of conductive nanomaterial. The first electrode 20 in this embodiment serves as a gate electrode that is disposed on a top dielectric layer 54, which is disposed on top of the bottom dielectric layer 28 and the channel 26.

Figure 4:
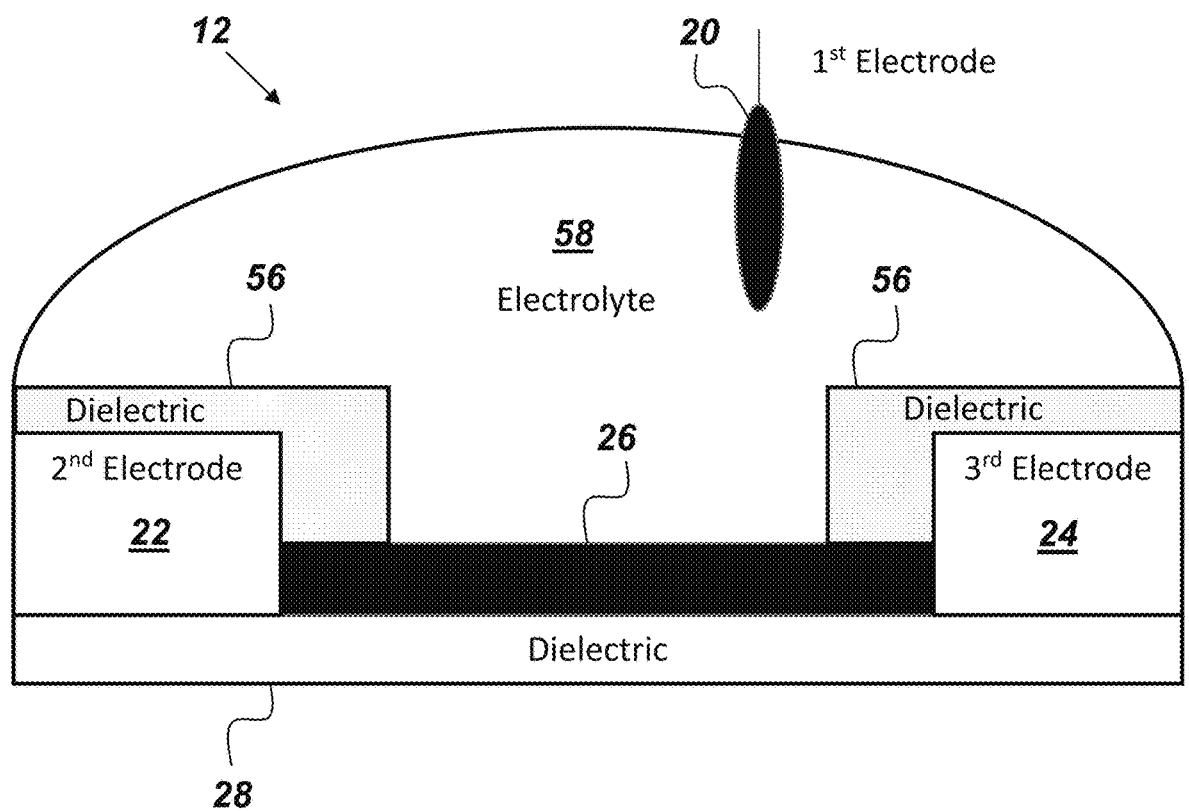
FIG. 4 is a side-view illustration of an embodiment of a true random number generator.

FIG. 4 is a side view of an electrolytic gate embodiment of the transistor 12. In this embodiment of the transistor 12, the second and third electrodes 22 and 24 are still connected by the channel 26 of conductive nanomaterial and are all disposed on the bottom dielectric layer 28. The second and third electrodes 22 and 24 are covered by encapsulating dielectrics 56, which separate the second and third electrodes 22 and 24 from an electrolyte 58. The first electrode 20 in this embodiment of the transistor 12 is partially disposed in the electrolyte 58.

Figure 5:
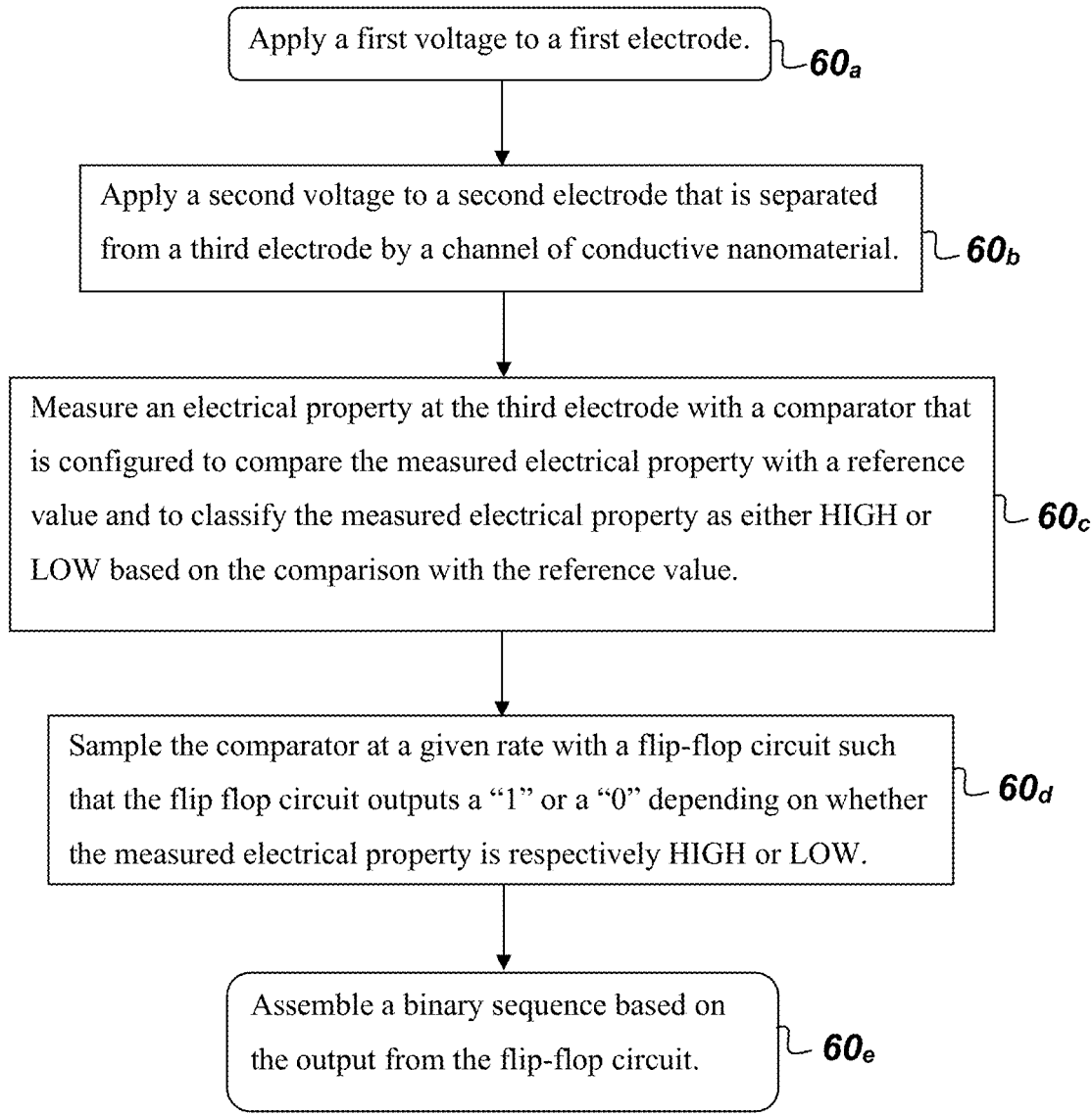
FIG. 5 is a flowchart of a method for generating a true random number.

FIG. 5 is a flowchart of a method 60 for generating true random numbers that comprises the following steps. The first step $60_a$ provides for applying a first voltage to a first electrode. The next step $60_b$ provides for applying a second voltage to a second electrode that is separated from a third electrode by a channel of conductive nanomaterial. The second and third electrodes are both disposed on, and separated from the first electrode by, a dielectric layer. The next step $60_c$ provides for measuring an electrical property at the third with a comparator that is configured to compare the measured electrical property with a reference value and to classify the measured electrical property as either HIGH or LOW based on the comparison with the reference value. The measured electrical property varies randomly over time due to RTS noise due to defects in one or both of the dielectric layer and the channel of conductive nanomaterial. The next step $60_d$ provides for sampling the comparator at a given rate with a flip-flop circuit such that the flip flop circuit outputs a "1" or a "0" depending on whether the measured electrical property is respectively HIGH or LOW. The next step $60_e$ provides for assembling a binary sequence based on the output from the flip-flop circuit.

The binary sequence assembled by method 60 may be used to seed a PRNG or as a true random binary number. Additional defects may be added to an interface between the channel of conductive nanomaterial and the dielectric layer by bombarding the dielectric layer with ionizing radiation so as to increase the amount of RTS noise. The amount of RTS noise may also be increased by adding defects to an interface between the channel of conductive nanomaterial and the dielectric layer by introducing molecular or elemental impurities into or onto the dielectric layer.

From the above description of the TRNG 10, it is manifest that various techniques may be used for implementing the concepts of TRNG 10 without departing from the scope of the claims. The described embodiments are to be considered in all respects as illustrative and not restrictive. The method/apparatus disclosed herein may be practiced in the absence of any element that is not specifically claimed and/or disclosed herein. It should also be understood that the TRNG 10 is not limited to the particular embodiments described herein, but is capable of many embodiments without departing from the scope of the claims.

We claim:

1. A method for generating true random numbers with a transistor that comprises first, second, and third electrodes, wherein the second electrode is separated from the third electrode by a channel of conductive nanomaterial, the method comprising the steps of:
    applying a first voltage to the first electrode to set a conductance across the second and third electrodes;
    applying a second voltage to the second electrode such that an electrical current flows between the second and third electrodes through the channel of conductive nanomaterial, wherein the second and third electrodes are both disposed on, and separated from the first electrode by, a dielectric layer, wherein the transistor does not have a dedicated trapping layer;
    measuring an electrical property at the third electrode with a comparator that is configured to compare the measured electrical property with a reference value and to classify the measured electrical property as either HIGH or LOW based on the comparison with the reference value, wherein the measured electrical property varies randomly over time due to random telegraph signals (RTSs) due to defects in the channel of conductive nanomaterial that cause conductance between the second and the third electrode to fluctuate around the set conductance level;
    sampling the comparator at a given rate with a flip-flop circuit such that the flip flop circuit outputs a "1" or a "0" depending on whether the measured electrical property is respectively HIGH or LOW; and
    assembling a binary sequence based on the output from the flip-flop circuit.

2. The method of claim 1, further comprising the step of using the binary sequence to seed a pseudo random number generator (PRNG).

3. The method of claim 1, further comprising the step of using the binary sequence as a random binary number.

4. The method of claim 3, further comprising the step of using a von Neumann extractor algorithm to remove bias for either 1s or 0s from the output of the flip-flop circuit.

5. The method of claim 1, further comprising the step of adjusting the first voltage to modulate an amount of time spent in a given HIGH or LOW state such that a bias between states is reduced.

6. The method of claim 1, wherein the channel of conductive nanomaterial is made of carbon nanotube material.

7. The method of claim 1, wherein the channel of conductive nanomaterial is made from a material selected from the group consisting of: graphene nanoribbons, nanowires composed of Si, Ge, metal oxide, III-V semiconductors, and II-VI semiconductor material.

8. The method of claim 1, further comprising the step of adding defects to the channel of conductive nanomaterial by modifying the chemical structure of the nanomaterial by using an approach selected from a group consisting of: oxidation, esterification, amidation, halogenation, cycloaddition, radical addition, nucleophilic addition, electrophilic addition, ion irradiation, electron irradiation, and ultraviolet irradiation.

9. The method of claim 1, further comprising the step of adding defects to the channel of conductive nanomaterial by tethering additional molecules to the nanomaterial.

10. The method of claim 1, wherein the defects in the channel of conductive nanomaterial are intrinsic to a fabrication process used to form the conductive nanomaterial.

11. The method of claim 10, wherein the transistor is an electrolytic-gate transistor.

12. A method for generating true random numbers with a transistor that comprises first, second, and third electrodes, wherein the second electrode is separated from the third electrode by a channel of conductive nanomaterial, the method comprising the steps of:
    introducing defects into the channel of conductive nanomaterial so as to generate random telegraph signals (RTSs) during operation of the transistor, such that the defects trap and untrap charge leading to resistance changes in the channel of conductive nanomaterial between the second and third electrodes, wherein the transistor does not have a dedicated trapping layer;
    applying a first voltage to the first electrode to set a conductance across the second and third electrodes;

applying a second voltage to the second electrode, wherein the second and third electrodes are both disposed on, and separated from the first electrode by, a dielectric layer;

measuring an electrical property at the third electrode with a comparator that is configured to compare the measured electrical property with a reference value and to classify the measured electrical property as either HIGH or LOW based on the comparison with the reference value, wherein the measured electrical property varies randomly over time due to the RTSs;

sampling the comparator at a given rate with a flip-flop circuit such that the flip flop circuit outputs a "1" or a "0" depending on whether the measured electrical property is respectively HIGH or LOW;

adjusting the first voltage to modulate an amount of time spent in a given HIGH or LOW state such that a bias between HIGH and LOW states is minimized; and assembling a binary sequence based on the output from the flip-flop circuit.

13. The method of claim 12, wherein the introducing defects step further comprises using van der Waals or pi-pi interactions to non-covalently introduce defects on the channel of conductive nanomaterial.

14. The method of claim 12, wherein the channel of conductive nanomaterial is suspended above a trench in the dielectric layer.

15. The method of claim 12, wherein the second and third electrodes are interdigitated and lead out to form contact pads.

16. The method of claim 12, wherein the introducing defects step comprises modifying the chemical structure of the nanomaterial by using an approach selected from a group consisting of: oxidation, esterification, amidation, halogenation, cycloaddition, radical addition, nucleophilic addition, electrophilic addition, ion irradiation, electron irradiation, and ultraviolet irradiation.

17. The method of claim 12, wherein the introducing defects step comprises tethering additional molecules to the nanomaterial.

18. The method of claim 12, wherein the defects in the channel of conductive nanomaterial are intrinsic to a fabrication process used to create the transistor.

19. The method of claim 12, wherein the channel of conductive nanomaterial is made from a material selected from the group consisting of: graphene nanoribbons, nanowires composed of Si, Ge, metal oxide, III-V semiconductors, and II-VI semiconductor material.

* * * * *